(12) United States Patent
Ikuta

(10) Patent No.: US 7,888,149 B2
(45) Date of Patent: Feb. 15, 2011

(54) SURFACE EMITTING LASER AND MANUFACTURING METHOD THEREFOR

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/562,605

(22) Filed: Sep. 18, 2009

(65) Prior Publication Data
US 2010/0080258 A1    Apr. 1, 2010

(30) Foreign Application Priority Data
Sep. 26, 2008  (JP) ............................. 2008-247737

(51) Int. Cl.
*H01L 21/00* (2006.01)
(52) U.S. Cl. ............................. 438/29; 438/31; 438/32; 438/34; 438/39; 438/46; 257/E21.002
(58) Field of Classification Search .................. 438/29, 438/31, 32, 34, 39, 46; 257/E21.002
See application file for complete search history.

(56) References Cited

U.S. PATENT DOCUMENTS

| 7,499,481 | B2 | 3/2009 | Ikuta ..................... 372/50.124 |
| 7,535,946 | B2 | 5/2009 | Nagatomo et al. ..... 372/50.124 |
| 7,807,485 | B2 * | 10/2010 | Uchida et al. ................. 438/29 |
| 2003/0063649 | A1 | 4/2003 | Ezaki et al. .................... 372/96 |
| 2006/0246700 | A1 | 11/2006 | Johnson ...................... 438/606 |
| 2007/0091961 | A1 | 4/2007 | Lin et al. ............... 372/50.124 |
| 2008/0107145 | A1 | 5/2008 | Hori et al. ...................... 372/99 |
| 2009/0034572 | A1 | 2/2009 | Ikuta ..................... 372/46.013 |
| 2009/0035884 | A1 | 2/2009 | Ikuta ........................... 438/29 |
| 2009/0086786 | A1 | 4/2009 | Ikuta ........................ 372/50.12 |
| 2009/0232179 | A1 | 9/2009 | Ikuta ..................... 372/50.124 |
| 2009/0262775 | A1 | 10/2009 | Uchida et al. .......... 372/50.124 |

FOREIGN PATENT DOCUMENTS

| EP | 1 798 827 A2 | 6/2007 |
| JP | 2003-110196 A | 4/2003 |
| WO | WO 2006/131316 A1 | 12/2006 |

OTHER PUBLICATIONS

H.J. Unold et al., "Large-Area Single-Mode VCSELs and the Self-Aligned Surface Relief," IEEE Journal on Selected Topics in Quantum Electronics, vol. 7, No. 2, Mar./Apr. 2001.
H.J. Unold et al., "Increased-area oxidised single-fundamental model VCSEL with self-aligned shallow etched surface relief," Electronics Letters, vol. 35, No. 16, 2 pgs., Aug. 5, 1999.

* cited by examiner

*Primary Examiner*—Jack Chen
(74) *Attorney, Agent, or Firm*—Fitzpatrick, Cella, Harper & Scinto

(57) ABSTRACT

Provided is a surface emitting laser or the like capable of suppressing horizontal misalignment between the surface relief structure and the current confining structure to make higher the precision of the alignment, to thereby obtain single transverse mode characteristics with stability. The surface emitting laser having a semiconductor layer laminated therein includes: a first etching region formed by etching a part of the upper mirror; and a second etching region formed by performing etching from a bottom portion of the first etching region to a semiconductor layer for forming a current confining structure, in which a depth of the second etching region is smaller than a depth of the first etching region.

5 Claims, 9 Drawing Sheets

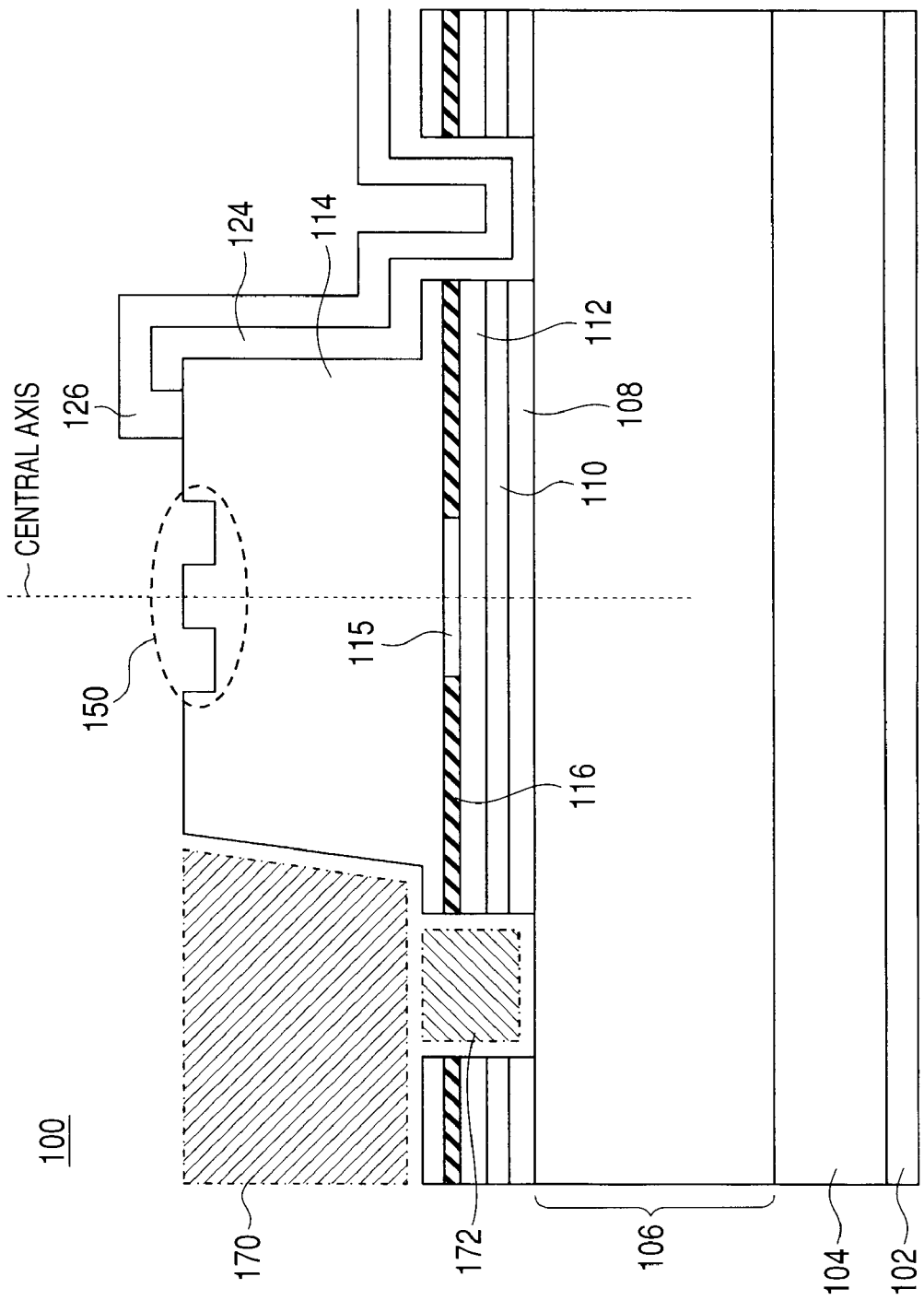

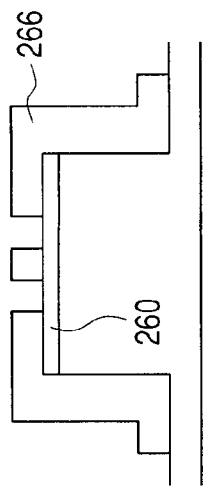
FIG. 4A
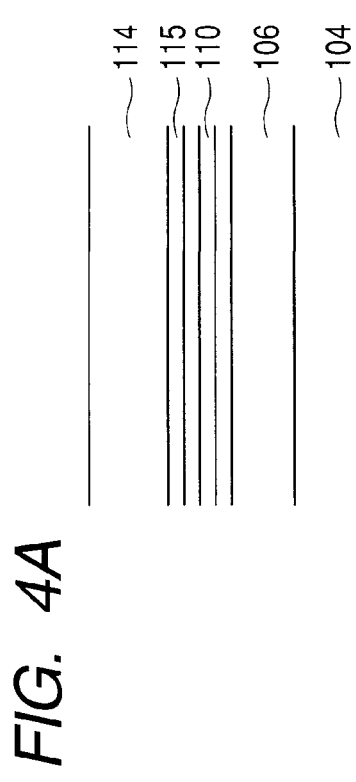
FIG. 4B
FIG. 4D
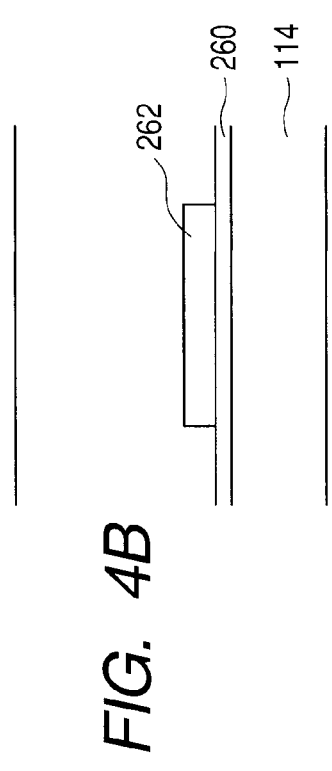
FIG. 4C
FIG. 4E
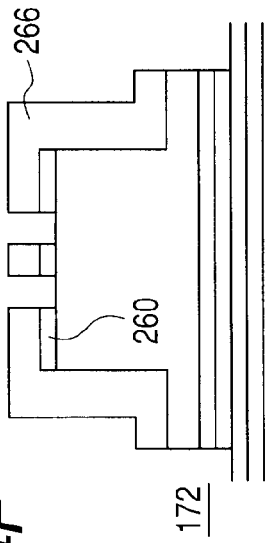
FIG. 4F
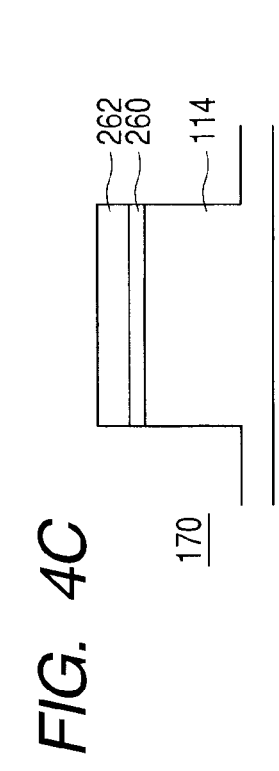

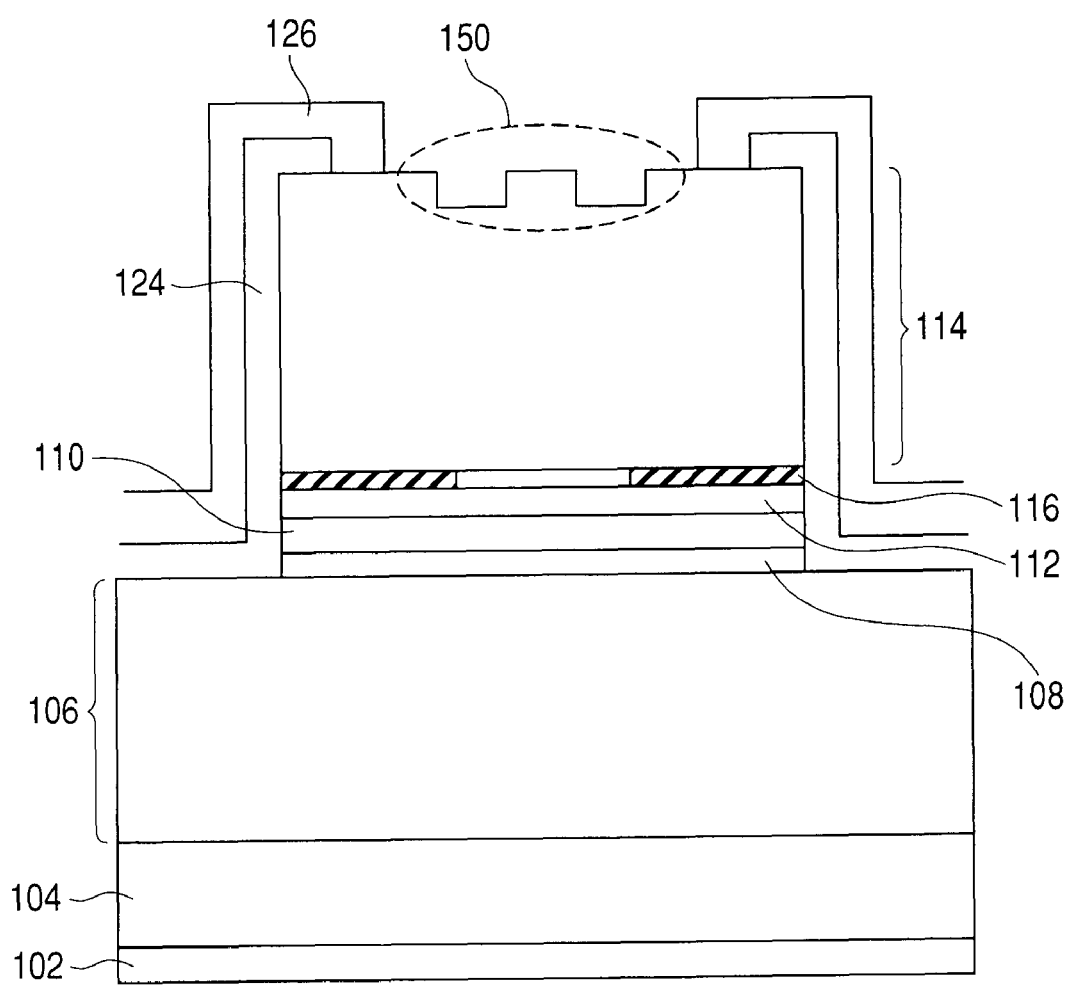

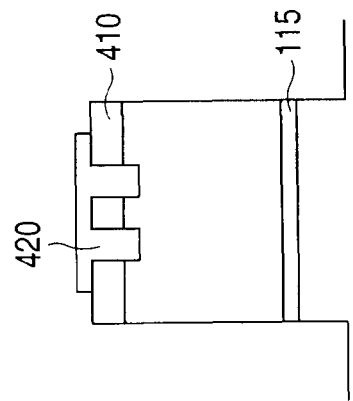
FIG. 6A
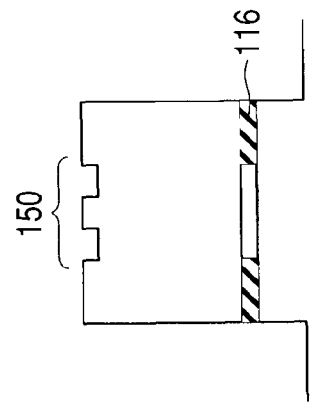
FIG. 6D
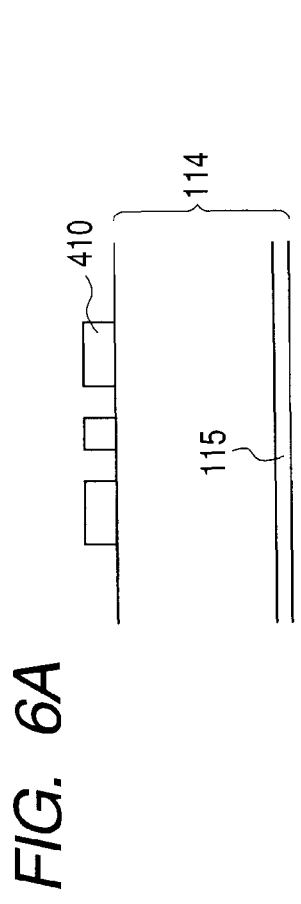
FIG. 6B
FIG. 6C
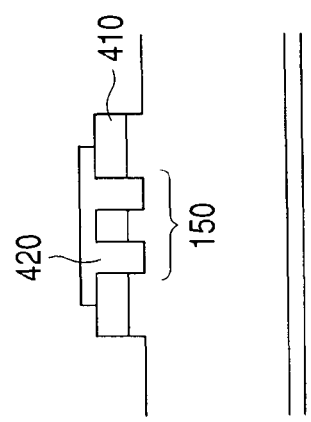
FIG. 6E

SURFACE EMITTING LASER AND MANUFACTURING METHOD THEREFOR

BACKGROUND OF THE INVENTION

1. Field of the Invention

The present invention relates to a surface emitting laser and a manufacturing method therefor.

2. Description of the Related Art

In a vertical cavity surface emitting laser (VCSEL) which is a kind of a surface emitting laser, light can be taken out in a direction perpendicular to a surface of a substrate. Therefore, a two-dimensional array can be formed with ease just by changing a mask pattern when a device is formed.

By parallel treatment using multiple beams emitted from the two-dimensional array, a higher density and a higher speed are made possible, and industrial application thereof to various fields such as optical communications is expected.

For example, when a surface emitting laser array is used as an exposure light source of an electro-photographic printer, a higher density and a higher speed of a printing process using multiple beams are made possible.

In such a printing process in electro-photography, because a stable and minute laser spot needs to be formed on a photosensitive drum, the laser is required to operate with stability in a single transverse mode and in a single longitudinal mode.

Recently, for higher performance of a surface emitting laser, a method of injecting current using selective oxidation as described in the following has been developed.

In the selective oxidation, an AlAs layer or an AlGaAs layer having a high Al composition ratio, for example, having an Al composition ratio of 98% is provided in a multilayer reflecting mirror. By its selective oxidation in a water vapor atmosphere at high temperature, a current confining structure is formed such that current is injected only into a region in which the current injection is necessary.

However, the above-mentioned selective oxidation for forming the current confining structure is not desirable from the viewpoint of operation in the single transverse mode.

More specifically, a difference in the refractive index which is larger than necessary is caused due to the existence of the oxide layer, which in turn causes a high order transverse mode.

Measures taken against this include a method of preventing confinement of the high order transverse mode by making the diameter of the light emitting region as small as about 3 μm to attain single transverse mode oscillation. However, in such a method, because the light emitting region becomes smaller, output per device is significantly lowered.

Further, because current is injected into a minute light emitting region, the current density becomes higher, which is a cause of increase in device resistance, shortened device life, and the like.

In view of the above, conventionally, methods of attaining single transverse mode oscillation while maintaining a light emitting region being large to some extent by intentionally introducing a loss difference between a fundamental transverse mode and the high order transverse mode are reviewed.

As one of such methods, H. J. Unold et al., Electronics Letters, Vol. 35, No. 16 (1999) discloses a method of making a high order transverse mode loss larger than a fundamental transverse mode loss by forming a stepped structure on a light emitting surface of a surface emitting laser device.

FIG. 5 is a schematic sectional view of a surface emitting laser in which a surface relief structure is formed according to the method.

It is to be noted that a structure having a step in a light emitting region of a light emitting surface of a reflecting mirror as described above is hereinafter referred to as a surface relief structure.

By the way, when a loss difference is given to respective optical modes of a VCSEL using the surface relief structure, horizontal alignment between the surface relief structure and the current confining structure is important.

More specifically, when only fundamental transverse mode oscillation is required, the amount of horizontal misalignment between the center of a current confining aperture and the center of a surface relief structure is, for example, preferably 1 μm or less, and more preferably 0.5 μm or less.

This is because, if the centers are misaligned, an unnecessary loss is given to the mode in which the oscillation is required (fundamental transverse mode in this case), or, a necessary loss can not be given to the mode in which the oscillation is not required (high order transverse mode).

In H. J. Unold et al., Electronics Letters, Vol. 35, No. 16 (1999), as such a method of forming the surface relief structure and the current confining structure with the surface relief structure and the current confining structure being aligned with each other, a method called a self-alignment process is disclosed.

This method is characterized in that the positioning and patterning of a surface relief structure and a mesa structure are carried out at the same time.

By etching the mesa, a side wall of a selective oxidation layer is exposed, from which the selective oxidation layer is oxidized, to thereby form the current confining structure.

Therefore, the horizontal alignment between the surface relief structure and the current confining structure is performed automatically.

FIGS. 6A to 6E are schematic views for describing the self-alignment process disclosed in H. J. Unold et al., Electronics Letters, Vol. 35, No. 16 (1999). FIGS. 6A to 6E describe a self-alignment process flow. As illustrated in FIG. 6A, a first resist 410 is applied to an upper mirror 114 of a wafer for a VCSEL, and the resist 410 is patterned at the same time in the shape of the surface relief structure and in the shape of the mesa structure. Here, a convex surface relief is illustrated.

Then, as illustrated in FIG. 6B, dry etching of the semiconductor is performed with the patterned resist 410 being used as a mask. The etching forms a surface relief structure 150.

Then, as illustrated in FIG. 6C, a second resist 420 is applied and patterned so as to protect the surface relief structure 150.

Then, as illustrated in FIG. 6D, wet etching is performed so as to form the mesa structure, and a high-Al-composition-ratio layer 115 is exposed at a side wall of the mesa.

Then, as illustrated in FIG. 6E, the resists 410 and 420 are removed and the high-Al-composition-ratio layer 115 is selectively oxidized to form a current confining structure 116.

From hereon, according to a standard process, an electrode is connected to the device to complete a VCSEL device.

By the way, in order to expose the selective oxidation layer by etching the mesa structure using the above-mentioned conventional self-alignment process such that the selective oxidation layer can be oxidized, the depth of the etching is required to be on the order of 3 to 4 μm.

In such deep etching, it is difficult to expose the side wall of the selective oxidation layer according to the position of the pattern of the mesa structure formed at the same time with the pattern of the surface relief structure. The reason is described in the following.

For example, when a deep mesa structure as described above is formed by wet etching, there are problems including difficulty in forming the mesa structure so as to be precisely vertical and liability to crystal orientation dependence of the semiconductor.

Further, when the deep mesa structure as described above is formed by dry etching, the resistance of the resist to the dry etching is low.

Therefore, there is a problem in that, because edge portions of the etching mask are damaged and pull back, the mesa structure can not be formed with high precision.

For those reasons, there is a possibility that the position at which the oxidation of the high-Al-composition-ratio layer starts (the position of the side wall exposed by the etching) is misaligned with the patterning position of the mesa structure.

In that case, the positions at which the oxidation starts are misaligned with the position of the patterned mask, and consequently, the size and the position of the current confining structure deviate from the size and the position that the current confining structure should have and become unstable.

As a result, as exemplarily illustrated in FIG. 7, there is a possibility that the surface relief structure and the current confining structure are not necessarily aligned with each other such that an effective single transverse mode VCSEL can not be obtained.

SUMMARY OF THE INVENTION

The present invention has been made in view of the above-mentioned problems, and an object of the present invention is to provide a surface emitting laser and a manufacturing method therefor which can suppress horizontal misalignment between a surface relief structure and a current confining structure to achieve higher precision of alignment and which can obtain single transverse mode characteristics with stability.

According to the present invention, the surface emitting laser and the manufacturing method therefor can be materialized which can suppress the horizontal misalignment between the surface relief structure and the current confining structure to achieve higher precision of the alignment and which can obtain single transverse mode characteristics with stability.

According to the present invention, the horizontal misalignment between the surface relief structure and the current confining structure due to a stepped structure formed for controlling the transverse mode can be suppressed to make higher the precision of the alignment. This is based on the following findings of the inventor(s) of the present invention.

As described above, when a deep mesa structure is etched, if the conventional self-alignment process is used and all the patterning is performed at the same time, it is difficult to form the mesa structure with high precision.

Therefore, according to the present invention, the mesa structure is not etched at a time, and the process of etching the mesa structure is divided into a first stage etching process of forming a first etching region and a second stage etching process of forming a second etching region.

In the second stage etching process, the above-mentioned self-alignment process is used to perform shallower etching compared with the etching of the first etching region in the first stage. Etching at least to a semiconductor layer for forming the current confining structure is performed to expose the semiconductor layer.

By dividing the etching process into the two stages, a depth of the etching necessary for exposing the semiconductor layer for the current confining structure can be made to be shallower than a depth of the conventional etching performed only once for exposing the semiconductor layer for the current confining structure.

Therefore, by etching the second etching region in the above-mentioned way, a position of a side surface of the exposed semiconductor layer for forming the current confining structure can be made nearer to a position of a predetermined patterning aligned with the surface relief structure.

This makes it possible to make higher the precision of the alignment between the surface relief structure and the current confining structure.

Further features of the present invention will become apparent from the following description of exemplary embodiments with reference to the attached drawings.

BRIEF DESCRIPTION OF THE DRAWINGS

FIG. 1 is a schematic sectional view illustrating an exemplary structure of a surface emitting laser according to Embodiment 1 of the present invention.

FIGS. 4A, 4B, 4C, 4D, 4E, 4F, 4G, 4H, and 4I are schematic views illustrating an exemplary method of manufacturing a surface emitting laser according to Embodiment 3 of the present invention.

FIG. 5 is a schematic sectional view of a surface emitting laser having a surface relief structure formed thereon according to a conventional method disclosed in H. J. Unold et al., Electronics Letters, Vol. 35, No. 16 (1999).

FIGS. 6A, 6B, 6C, 6D, and 6E are schematic views illustrating a self-alignment process in Unold et al, Electronics Letters, Vol. 35, No. 16 (1999).

DESCRIPTION OF THE EMBODIMENTS

Figure 2A:
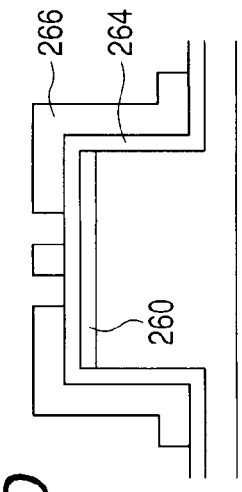
FIGS. 2A, 2B, 2C, 2D, 2E, 2F, 2G, 2H, 2I, 2J, and 2K are schematic views illustrating an exemplary method of manufacturing a surface emitting laser according to Embodiment 2 of the present invention.

Embodiments of the present invention are described in the following.

Embodiment 1

As Embodiment 1, an exemplary structure of a surface emitting laser in which a semiconductor layer including a lower mirror, an active layer, and an upper mirror is laminated on a substrate according to the present invention is described.

FIG. 1 is a schematic sectional view illustrating an exemplary structure of a vertical cavity surface emitting laser (hereinafter, referred to as a surface emitting laser) of this embodiment.

As illustrated in FIG. 1, in a surface emitting laser 100 of this embodiment, a lower mirror 106, a lower spacer layer 108, an active layer 110, an upper spacer layer 112, and an upper mirror 114 are laminated on a substrate 104.

A semiconductor layer which is a high-Al-composition-ratio layer 115 is provided in the upper mirror 114 or between the upper mirror 114 and the active layer 110. A part of the high-Al-composition-ratio layer 115 is oxidized to form a current confining structure 116.

The high-Al-composition-ratio layer 115 can be formed of materials of $Al_xGa_{(1-x)}As$ (0.9<x≦1) or AlAs.

A mesa structure is formed in the surface emitting laser 100 by a first etching region 170 which forms a part of the region on a front surface side of the upper mirror 114.

The mesa structure formed by the first etching region 170 is above the high-Al-composition-ratio layer 115.

Further, a second etching region 172 is provided below the first etching region 170.

The second etching region 172 forming the mesa structure ranges from below the first etching region 170 to the high-Al-composition-ratio layer 115 in the upper mirror 114 or between the upper mirror 114 and the active layer 110 at least under the first etching region 170.

The depth of the second etching region 172 is formed by etching shallower than the depth of the first etching region 170.

Further, in the second etching region 172, a side wall of the high-Al-composition-ratio layer 115 is exposed, and, as described above, a part of the high-Al-composition-ratio layer 115 is oxidized from the side wall to form the current confining structure 116 for spatially restricting current injection into the active layer 110.

Further, a surface relief structure 150 formed by a stepped structure for controlling a transverse mode and the current confining structure 116 are horizontally aligned.

More specifically, the surface relief structure 150 is provided over the upper mirror 114 so as to be at the center of the mesa structure.

The surface relief structure 150 and the second etching region 172 are aligned in the direction of a surface of the substrate 104.

For example, here, the surface relief structure 150 is a concentric convex relief structure and is designed such that the reflectivity in a center portion of the upper mirror 114 is higher.

Further, the center of the surface relief structure 150 and the center of an aperture in the current confining structure 116 are vertically aligned.

An insulating film 124 is provided on a part of an upper surface and the side wall of the mesa structure.

A contact layer (not shown) is provided on an uppermost portion of the upper mirror 114, and an upper electrode 126 is connected to a part of the contact layer.

An opening for taking out light is provided in the upper electrode 126.

Further, a lower electrode 102 is connected to a rear side of the substrate 104.

The structure of the surface emitting laser 100 of this embodiment is as described above. By applying predetermined voltage between the upper electrode 126 and the lower electrode 102, the active layer 110 emits light, the surface emitting laser 100 oscillates, and laser light is emitted through the opening in the upper electrode.

As described above, the etching process is divided into two stages and the depth of the second stage etching is shallower than the depth of the first stage etching. By the second stage etching, the semiconductor layer for forming the current confining structure is exposed. This makes it possible to make higher precision of the alignment between the surface relief structure and the current confining structure, and thus, a surface emitting laser which can obtain single transverse mode characteristics with stability can be provided.

By the way, when, as the high-Al-composition-ratio layer, an AlGaAs layer having a high Al composition ratio, in particular, an AlAs layer, is used and is selectively oxidized, the speed of the oxidation depends on the crystal orientation. For example, the speed of the selective oxidation in a surface along a (100) axis is higher than the speed of the selective oxidation in a surface along a (110) axis. In this case, when the selective oxidation of the high-Al-composition-ratio layer starts from the side surface of the circular mesa, the shape of the aperture in the current confining structure 116 is quadrangle.

Further, when a normally used (100) surface substrate is not used but a tilted substrate having an off-angle of 5° or more, for example, 10°, from the (100) surface is used, the quadrangular shape is further distorted.

Here, from the viewpoint of reliability, it is preferred that the current confining structure is circular. When a circular current confining structure is required to be obtained, the distance from the center portion to the side wall of the high-Al-composition-ratio layer may be determined taking into consideration the difference in the speed of the oxidation in the directions of the respective surfaces of the high-Al-composition-ratio layer. In this case, if the position at which the oxidation of the high-Al-composition-ratio layer starts is misaligned with the position of the patterning, it is difficult to form the aperture in the current confining structure such that its shape is circular.

However, in the surface emitting laser formed by etching in the two stages as described above, the position at which the oxidation starts and the position of the patterning can be aligned with high precision, and hence the aperture can be formed such that its shape is circular. Therefore, the aperture in the current confining structure and the surface relief structure can be aligned with high precision, and thus, a surface emitting laser which can obtain single transverse mode characteristics with stability can be provided.

Embodiment 2

Next, as Embodiment 2, an exemplary method of manufacturing a surface emitting laser in which the semiconductor layer is laminated on a substrate according to the present invention to form a surface emitting laser is described.

FIGS. 2A to 2K are schematic views illustrating the exemplary method of manufacturing the surface emitting laser according to this embodiment.

FIGS. 2A to 2K illustrate manufacturing steps of the surface emitting laser according to this embodiment.

In FIGS. 2A to 2K, like reference numerals designate like or identical members illustrated in FIG. 1 in Embodiment 1.

In the method of manufacturing the surface emitting laser according to this embodiment, first, in a step illustrated in FIG. 2A, the layers from the lower mirror 106 to the upper mirror 114 are made to grow in the stated order on an n-type GaAs substrate 104.

For example, the lower mirror 106, the lower spacer layer 108, and the active layer 110 are made to grow by metal organic chemical vapor deposition (MOCVD).

Further, the upper spacer layer 112, the high-Al-composition-ratio layer 115, and the upper mirror 114 are made to grow on the active layer 110.

The active layer 110 has a gain at wavelength λ wherein λ is an oscillation wavelength of the surface emitting laser 100. λ is, for example, 680 nm.

More specifically, for example, a GaAs substrate is used as the substrate 104. The GaAs substrate used is a tilted substrate with a principal surface thereof being tilted 5 degrees or more from the (100) surface.

The lower mirror 106 is a distributed bragg reflector (DBR) made of sixty pairs of n-type AlAs layers and $Al_{0.5}Ga_{0.5}As$ layers and the optical thickness of each of the layers is λ/4.

The lower spacer layer 108 is an n-type AlGaInP layer and the active layer 110 has multiple quantum well structures of GaInP/AlGaInP.

Further, the upper spacer layer 112 is a p-type AlInP layer and the upper mirror 114 is a DBR made of thirty-eight pairs of p-type $Al_{0.9}Ga_{0.1}As$ layers and $Al_{0.5}Ga_{0.5}As$ layers. The optical thickness of each of the layers is $\lambda/4$.

The thicknesses of the lower spacer layer 108 and the upper spacer layer 112 are adjusted such that the active layer 110 falls at a loop of a standing wave which is resonated with a vertical resonator formed by the lower mirror 106 and the upper mirror 114.

Further, the high-Al-composition-ratio layer 115 is provided in the upper mirror 114 (for example, at the first pair counted from the side of the active layer 110).

More specifically, the high-Al-composition-ratio layer 115 is formed of $Al_{0.98}Ga_{0.02}As$, and has a thickness of 30 nm.

An uppermost layer of the upper mirror 114 is a GaAs contact layer which has a thickness of 20 nm.

Figure 2B:
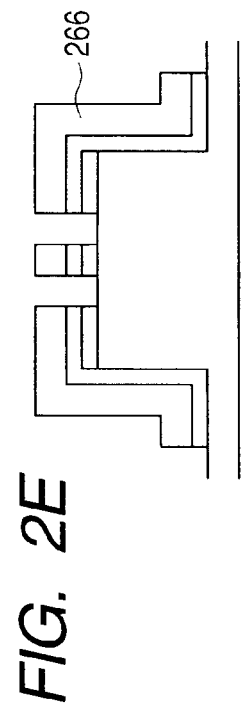

Then, in a step illustrated in FIG. 2B, a first protective layer 260 is formed. After a first resist 262 is applied, the mesa structure is patterned.

The first protective layer 260 is formed of, for example, $SiO_2$ or SiN, and has a thickness of, for example, 200 nm.

The first protective layer 260 is formed by, for example, plasma chemical vapor deposition (CVD). The diameter of the mesa structure is, for example, 26 μm.

Figure 2C:
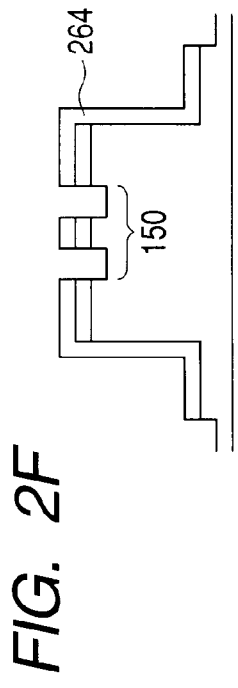

Then, in a step illustrated in FIG. 2C, wet etching of the first protective layer 260 is performed with the first resist 262 being used as a mask.

In this etching, for example, buffered hydrofluoric acid is used.

Further, the upper mirror 114 is etched with the first resist 262 and the first protective layer 260 being used as a mask.

This etching is, for example, dry etching or wet etching, and, for example, reactive ion etching using $SiCl_4$/Ar gas.

In the etching step illustrated in FIG. 2C, a first etching region in which the etching region does not reach the high-Al-composition-ratio layer 115 is formed.

More specifically, in the step illustrated in FIG. 2C, a region corresponding to the first etching region 170 above the high-Al-composition-ratio layer 115 in the mesa structure described in FIG. 1 in Embodiment 1 is etched as the first etching region.

Figure 2D:
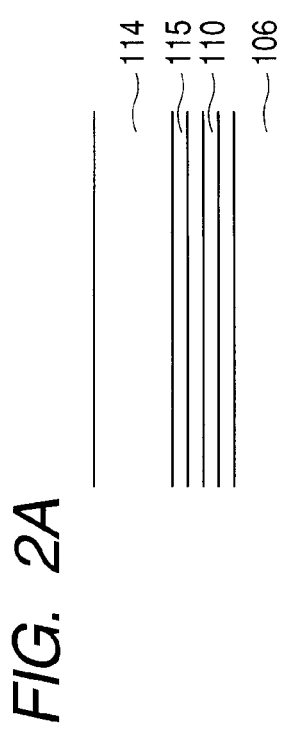

Then, in a step illustrated in FIG. 2D, the first resist 262 is removed and a second protective layer 264 is formed so as to cover the mesa structure.

The first resist 262 is removed by, for example, asking with oxygen plasma.

The second protective layer 264 is formed of, for example, $SiO_2$ or SiN, and is formed by plasma CVD.

The thickness of the second protective layer 264 may be, for example, 500 nm.

After that, a second resist 266 is applied, and patterning for forming the surface relief structure 150 and an etching region for exposing the side wall of the high-Al-composition-ratio layer 115 is performed.

The patterning is performed for the purpose of forming the etching region corresponding to the second etching region 172 which is further provided under the first etching region 170 described in FIG. 1 in Embodiment 1 and the depth of which is shallower than the depth of the first etching region 170.

The patterning is performed by, for example, projection-type photolithography using the same mask.

It is preferred that the photolithography is performed such that the depth of focus of the second resist 266 is equal to or deeper than the depth of the first etching region 170.

The second etching region 172 is formed in the shape of, for example, a ring surrounding the mesa structure.

The patterning for forming the second etching region 172 is performed with regard to the second resist 266 immediately under the first etching region 170.

The surface relief structure 150 and the second etching region 172 are patterned such that their centers are aligned.

It is to be noted that their centers are not necessarily required to be aligned with the center of the mesa structure (the structure surrounded by the first etching region 170).

Figure 2E:
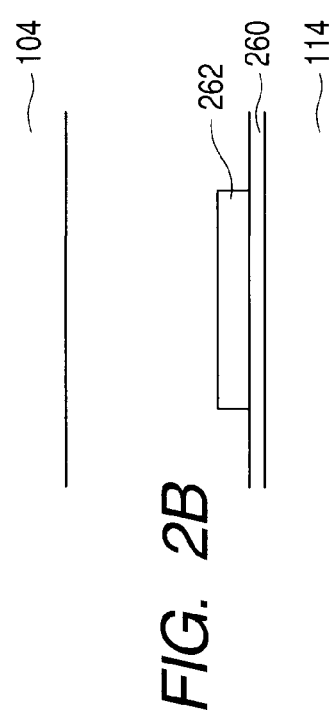

Then, in a step illustrated in FIG. 2E, the second protective layer 264 and the first protective layer 260 are etched with the second resist 266 being used as a mask.

In etching the second protective layer 264 and the first protective layer 260, for example, buffered hydrofluoric acid is used.

Figure 2F:
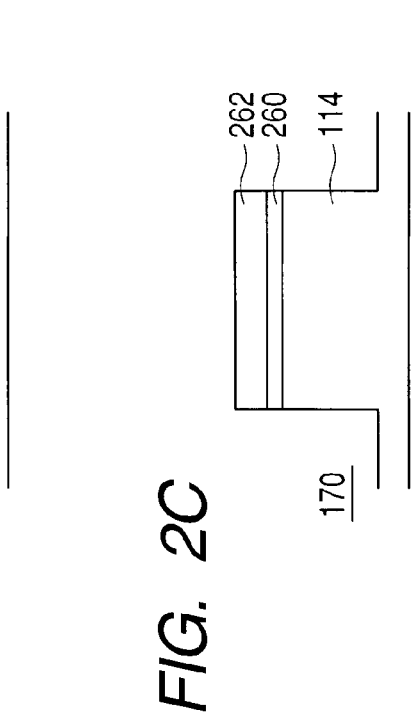

Then, in a step illustrated in FIG. 2F, the second resist 266 is removed. The second resist 266 is removed by, for example, acetone.

After that, an upper portion of the upper mirror 114 is etched with the second protective layer 264 being used as a mask to form the surface relief structure 150 in the upper mirror 114. The upper mirror 114 is etched by wet etching.

Figure 2G:
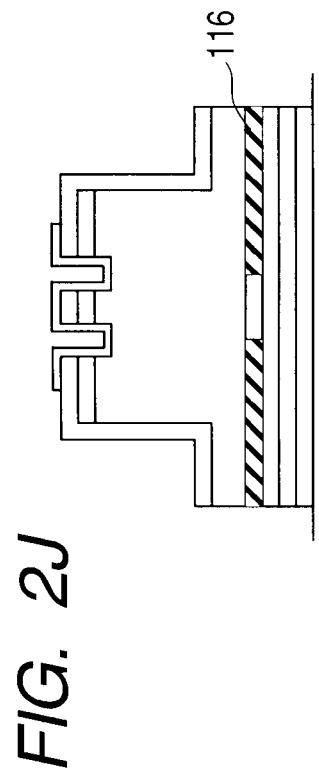

Then, in a step illustrated in FIG. 2G, a third protective layer 268 is formed so as to cover the mesa structure and the surface relief structure 150.

The third protective layer 268 is formed of, for example, $SiO_2$ or SiN, and is formed by plasma CVD.

The thickness of the third protective layer 268 is, for example, 100 nm.

Then, a third resist 274 is applied and patterned such that the third resist 274 covers the etched portion of the surface relief structure 150 and such that the third resist 274 does not extend beyond an upper portion of the mesa.

Figure 2H:

Then, in a step illustrated in FIG. 2H, the third protective layer 268 is etched with the third resist 274 being used as a mask.

In this etching, for example, buffered hydrofluoric acid is used. In this case, the second protective layer 264 exists on a side of a part of the third protective layer 268 which is nearer to the mesa. The etching time is adjusted so that all of the second protective layer 264 is not etched away.

Figure 2I:
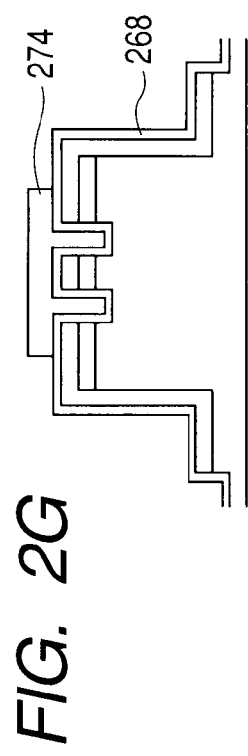

Then, in a step illustrated in FIG. 2I, etching is performed with the third resist 274 and the second protective layer 264 being used as a mask to form the second etching region 172.

The second etching region 172 is an etching region corresponding to the second etching region 172 which is under the first etching region 170 described with reference to FIG. 1 in Embodiment 1 described above and the depth of which is shallower than the depth of the first etching region 170.

The etching is dry etching or wet etching.

In the etching of the second etching region 172, the etching is performed from the upper mirror 114 under the first etching region 170 until at least the high-Al-composition-ratio layer 115 is exposed.

In the step illustrated in FIG. 2I in this embodiment, the second etching region 172 is etched to the lower spacer layer 108.

Figure 2J:
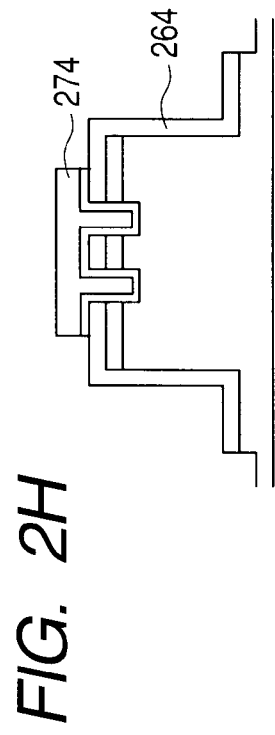

Then, in a step illustrated in FIG. 2J, after the third resist 274 is removed, a part of the high-Al-composition-ratio layer 115 is oxidized to form the current confining structure 116.

The third resist 274 is removed by, for example, acetone. The high-Al-composition-ratio layer 115 is oxidized by, for example, heating the high-Al-composition-ratio layer 115 to 400° C. and placing the high-Al-composition-ratio layer 115 in a water vapor atmosphere for 30 minutes.

The high-Al-composition-ratio layer 115 is oxidized from its side surface which is exposed to the second etching region 172. The diameter of the aperture in the current confining structure 116 formed by oxidation is, for example, 6 μm.

Figure 2K:
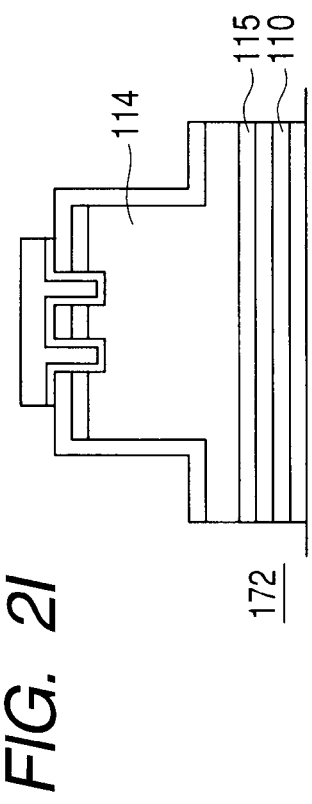

Then, in a step illustrated in FIG. 2K, the third protective layer 268, the second protective layer 264, and the first protective layer 260 are removed using, for example, buffered hydrofluoric acid.

From hereon, according to a standard process, an electrode is connected to the device to complete the surface emitting laser 100.

More specifically, as illustrated in FIG. 1, the insulating film 124 is formed so as to cover the mesa structure and a part of the insulating film 124 on the upper portion of the mesa is removed.

After that, the upper electrode 126 is formed on the mesa structure and the insulating film 124 such that the opening is provided in a light emitting portion (including the surface relief structure 150), while the lower electrode 102 is formed on a lower side of the substrate 104.

As the insulating film 124, for example, an SiO$_2$ film at a thickness of 200 nm is formed by, for example, plasma CVD.

The upper electrode 126 is formed of, for example, Ti/Au, and is formed by lift-off.

The lower electrode 102 is formed of, for example, AuGe/Au. It is to be noted that, if necessary, the surface emitting laser 100 may be annealed at about 300° C. to improve the extent of contact at an interface between the electrode and the semiconductor.

In the manufacturing method described in the above, the depth of the etching necessary for exposing the high-Al-composition-ratio layer 115 may be shallower than the depth in a conventional case.

More specifically, the depth of the etching of the second etching region may be 500 nm or more and 1 μm or less, 100 nm or more and 500 nm or less, or shallower.

Therefore, the position of the exposed side surface of the high-Al-composition-ratio layer 115 is made nearer to the position of the predetermined patterning aligned with the surface relief structure 150.

Therefore, a surface emitting laser in which the precision of the relative alignment between the aperture in the current confining structure 116 formed by oxidation from the side surface of the high-Al-composition-ratio layer 115 and the surface relief structure 150 is high is materialized.

When the first etching region 170 is etched, the high-Al-composition-ratio layer is not exposed, and hence horizontal spread of the etching is not so important. Therefore, the etching is not limited to dry etching and wet etching may also be used.

When wet etching is used, an etching stop layer may be used to control the depth of the first etching region 170.

More specifically, an etching stop layer is provided above the high-Al-composition-ratio layer 115 such that the etching of the first etching region stops at the etching stop layer.

As a result, the requirement that the first etching region 170 should not reach the high-Al-composition-ratio layer 115 can be satisfied with ease.

For example, an etchant used in etching the first etching region 170 may be a phosphoric acid based etchant and, as the first etching stop layer, for example, an AlInP layer at a thickness of 50 to 100 nm may be used.

In etching the second etching region 172, it is desirable that the side surface of the high-Al-composition-ratio layer 115 is exposed at a position which is substantially at an edge of the patterning.

Whether the second etching region 172 is etched by dry etching or wet etching, it is desirable that the distance from the position at which the etching of the second etching region 172 starts to the high-Al-composition-ratio layer 115 be as short as possible.

When the distance from the position at which the etching of the second etching region 172 starts to the high-Al-composition-ratio layer 115 is short enough, the position of the side surface of the exposed high-Al-composition-ratio layer 115 can be sufficiently controlled also by using isotropic wet etching.

For example, when the amount of misalignment between the center of the aperture in the current confining structure 116 and the center of the surface relief structure 150 is required to be 0.4 μm or less, it is sufficient that the above-mentioned distance is set to be 0.4 μm or less.

On the other hand, when, as in a conventional case, the etching starts from the uppermost portion of the upper mirror 114 to expose the high-Al-composition-ratio layer 115, the etching of about 3 μm is required, but it is difficult to align the center of the surface relief structure 150 and the center of the aperture in the current confining structure 116 with that precision.

When the second etching region 172 is etched by wet etching, by using an etching stop layer similarly to the case of the etching of the first etching region 170, the depth of the etching can be controlled.

Here, the second etching region 172 may be etched using two kinds of etchants. On the other hand, when the second etching region 172 is etched using dry etching in which the amount of vertical etching is large, the position of the edge of the patterning and the position of the side surface of the high-Al-composition-ratio layer 115 can be aligned with higher precision.

Next, a specific example of using wet etching when the first etching region 170 and the second etching region 172 are etched is described.

Figure 3:
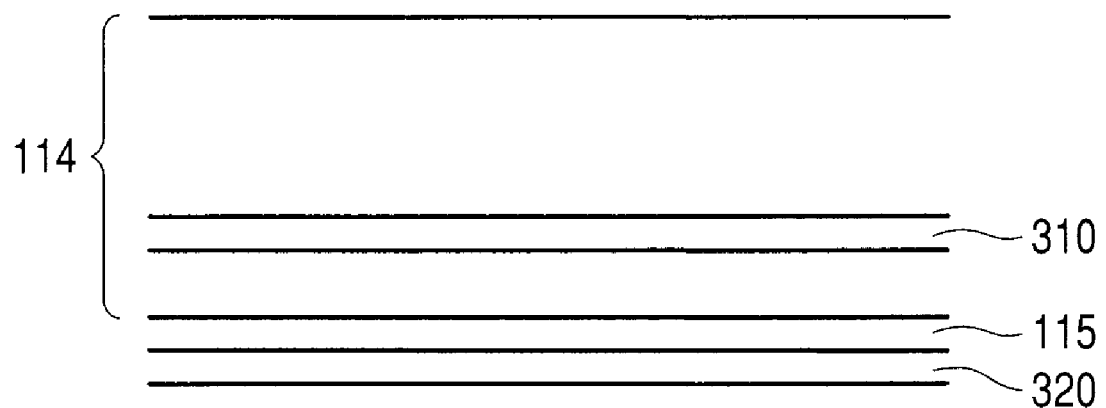
FIG. 3 illustrates a layer structure for describing a specific example of using wet etching when a first etching region and a second etching region are etched in Embodiment 2 of the present invention.

FIG. 3 illustrates a layer structure for describing the specific example.

As illustrated in the layer structure of the specific example in FIG. 3, a first etching stop layer 310 which is an AlGaInP layer is provided above the high-Al-composition-ratio layer 115 which is an AlAs layer while a second etching stop layer 320 which is made of AlGaInP is provided below the high-Al-composition-ratio layer 115.

The first etching stop layer 310 is sandwiched in the upper mirror 114 which is an AlGaAs multilayer reflecting mirror.

An etchant used in etching the first etching region 170 is, for example, a phosphoric acid based etchant which is, for example, a mixture of phosphoric acid, a hydrogen peroxide aqueous solution (31%), and water with the volume ratio of the phosphoric acid, the hydrogen peroxide aqueous solution, and the water being 4:1:90.

The etchant etches an AlGaAs semiconductor while the etchant hardly etches an AlGaInP layer.

Therefore, the etching of the first etching region 170 stops when the etching reaches the first etching stop layer 310.

In etching the second etching region 172, first, the first etching stop layer 310 is removed using buffered hydrofluoric acid, and then, the remaining upper mirror 114 and the high-Al-composition-ratio layer 115 are etched using the above-mentioned phosphoric acid based etchant.

The etching of the second etching region 172 stops when the etching reaches the second etching stop layer 320.

Embodiment 3

Next, as Embodiment 3, a method of manufacturing a surface emitting laser which is different from the above-mentioned manufacturing method of Embodiment 2 in that a surface relief structure is formed after a current confining structure is formed is described.

FIGS. 4A to 4I illustrate manufacturing steps of the surface emitting laser according to this embodiment.

In FIGS. 4A to 4I, like reference numerals designate like or identical members illustrated in FIGS. 2A to 2K in Embodiment 2.

The method of manufacturing the surface emitting laser according to this embodiment is different from the above-mentioned manufacturing method of Embodiment 2 in that the surface relief structure 150 is formed after the current confining structure 116 is formed while, in the manufacturing method of Embodiment 2, the surface relief structure 150 is formed before the current confining structure 116 described above is formed.

The manufacturing method according to this embodiment is advantageous in that, compared with the manufacturing method of Embodiment 2, the number of steps is smaller.

In the method of manufacturing the surface emitting laser according to this embodiment, in steps illustrated in FIGS. 4A to 4C, similarly to the case of the manufacturing method of Embodiment 2, the layers are made to grow sequentially on the substrate.

More specifically, in the step illustrated in FIG. 4A, the lower mirror 106, the lower spacer layer 108, the active layer 110, the upper spacer layer 112, the high-Al-composition-ratio layer 115, and the upper mirror 114 are made to grow on the n-type GaAs substrate 104.

Here, the uppermost portion of the upper mirror 114 forms a GaAs contact layer having a thickness of 20 nm or more.

Then, in the step illustrated in FIG. 4B, the first protective layer 260 is formed. After the first resist 262 is applied, the mesa structure is patterned.

After that, in the step illustrated in FIG. 4C, the first protective layer 260 is wet etched with the first resist 262 being used as a mask.

The upper mirror 114 is etched with the first resist 262 and the first protective layer 260 being used as a mask.

The steps illustrated in FIGS. 4A to 4C are the same as the steps illustrated in FIGS. 2A to 2C, and thus, detailed description thereof is omitted.

Then, in a step illustrated in FIG. 4D, the second resist 266 is applied, and patterning for forming the surface relief structure 150 and an etching region (second etching region 172) for exposing the side wall of the high-Al-composition-ratio layer 115 is performed.

The second resist 266 is patterned in the same way as the second resist is patterned in Embodiment 2.

Then, in a step illustrated in FIG. 4E, the second etching region 172 is etched with the second resist 266 being used as a mask.

The etching is, for example, wet etching, and an etchant used in the etching is, for example, a phosphoric acid based etchant.

Then, in a step illustrated in FIG. 4F, the first protective layer 260 is etched with the second resist 266 being used as a mask. The etching is, for example, wet etching. An etchant which hardly etches the GaAs contact layer which is the uppermost layer of the upper mirror 114 is used. An example of the etchant includes buffered hydrofluoric acid.

Through the steps illustrated in FIGS. 4E and 4F, the side wall of the high-Al-composition-ratio layer 115 is exposed.

Further, it is desirable that the GaAs contact layer which is the uppermost layer of the upper mirror 114 is hardly damaged.

Figure 4G:
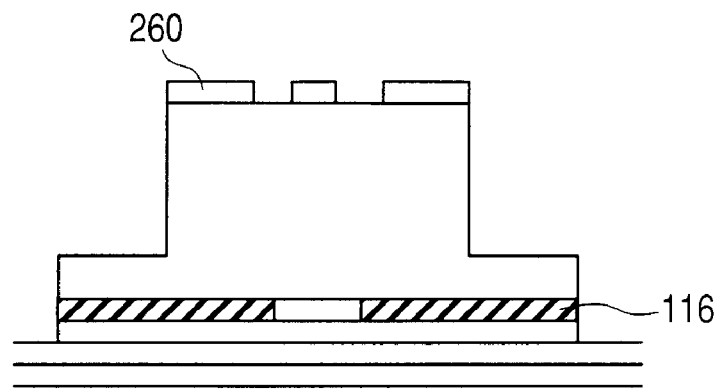

Then, in a step illustrated in FIG. 4G, after the second resist 266 is removed, a part of the high-Al-composition-ratio layer 115 is oxidized to form the current confining structure 116.

The second resist 266 is removed by, for example, acetone. The high-Al-composition-ratio layer 115 is oxidized by, for example, heating the high-Al-composition-ratio layer 115 to 400° C. and placing the high-Al-composition-ratio layer 115 in a water vapor atmosphere for 30 minutes.

The high-Al-composition-ratio layer 115 is oxidized from its side surface which is exposed to the second etching region 172. The diameter of the aperture in the current confining structure 116 formed by the oxidation is, for example, 6 μm. It is to be noted that a part of the GaAs layer which is the uppermost layer of the upper mirror 114 is exposed to the water vapor atmosphere, but it is hardly oxidized at 500° C. or lower.

Figure 4H:
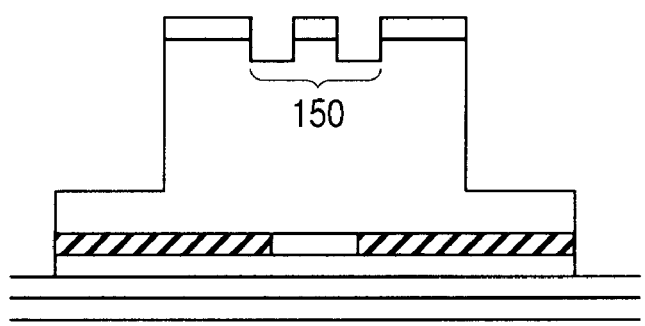

Then, in a step illustrated in FIG. 4H, the upper portion of the upper mirror 114 is etched with the first protective layer 260 being used as a mask to form the surface relief structure 150 in the upper mirror 114.

The upper mirror 114 is etched by wet etching.

Figure 4I:
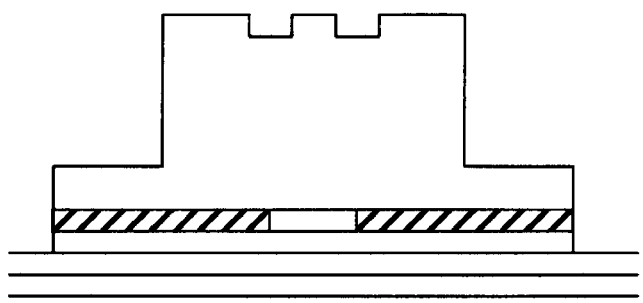
Figure 7:
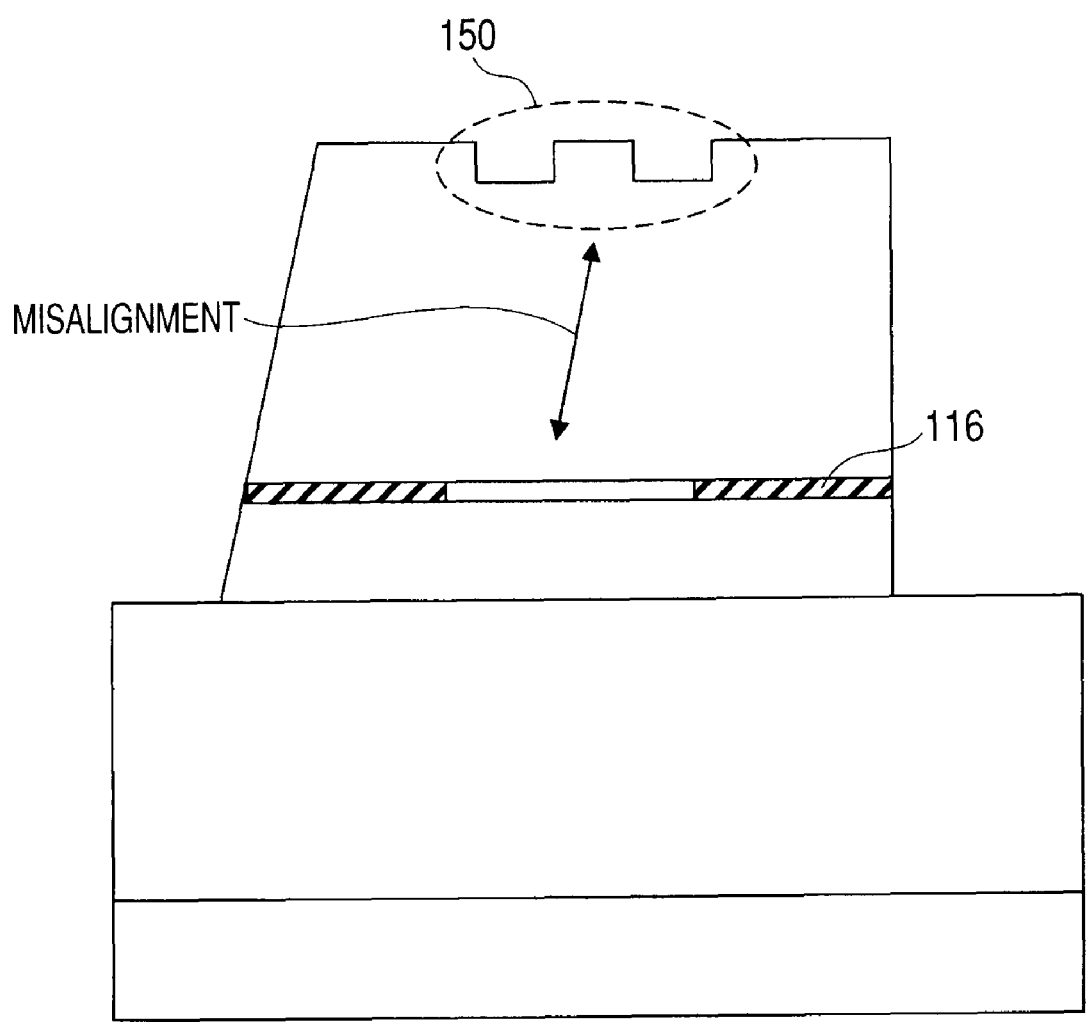
FIG. 7 is a schematic view illustrating a conventional case in which the surface relief structure and a current confining structure are misaligned.

Then, in a step illustrated in FIG. 4I, the first protective layer 260 is removed by, for example, buffered hydrofluoric acid.

From hereon, similarly to the case of Embodiment 2, according to a standard process, an electrode is connected to the device to complete the surface emitting laser 100.

In the above embodiments, the second etching region 172 is formed so as to be circular and surround the mesa structure, but it is not necessarily required to be circular. Further, the second etching region 172 may be divided into multiple parts.

For example, in a specific case of oxidizing a high-Al-composition-ratio layer high in Al composition ratio, such as an AlAs layer, in order to obtain a circular shape of the current confining aperture, the second etching region 172 may be disposed taking into consideration the in-plane anisotropy of the speed of the oxidation.

The same can be said of a case, for example, of oxidizing a high-Al-composition-ratio layer when a tilted substrate is used.

In order to obtain a circular shape of the current confining aperture, the second etching region 172 may be disposed taking into consideration the in-plane anisotropy of the speed of the oxidation.

According to the present invention, because the depth of the etching of the second etching region 172 can be made shallow, the second etching region can be disposed according to a predetermined pattern with higher precision, and thus, the effect of the surface relief structure can be produced with higher reliability.

Further, the mesa structure may be circular but it is not essential.

Further, the materials of the semiconductor, the electrodes, the dielectric, and the like, are not limited to the ones disclosed herein and other materials may also be used within the gist of the present invention.

Further, with regard to the method of manufacturing the surface emitting laser, other steps may be added to or may replace the steps disclosed herein which fall within the scope of the present invention. For example, a cleaning step and the like may be inserted.

Further, the etchant for etching the semiconductor and the dielectric disclosed in the above embodiments may include other etchants than the one disclosed in the above embodiments as long as the other etchants fall within the scope of the present invention.

Still further, in the above embodiments, with regard to the mode control by the surface relief structure, a zero-order transverse mode is made to be a single mode, and thus, the relief structure has two regions, namely, a center portion of a light emitting region having a high reflectivity, and a peripheral portion thereof having a low reflectivity.

However, it is also possible to use the surface relief structure to suppress zero-order mode oscillation and to make the surface emitting laser oscillate in a specific high order mode. The surface relief structure may have various shapes and sizes in order to obtain a surface emitting laser having desired optical characteristics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-247737, filed Sep. 26, 2008, which is hereby incorporated by reference herein in its entirety.

What is claimed is:

1. A method of manufacturing a surface emitting laser comprising:
    laminating a semiconductor layer on a substrate, the semiconductor layer including a lower mirror, an active layer, and an upper mirror;
    forming a first etching region by etching a part of the upper mirror from an upper portion of the upper mirror;
    forming a resist on the upper mirror following the forming the first etching region;
    patterning the resist to form a pattern for forming a surface relief structure by a stepped structure and for forming a second etching region as one step;
    forming the second etching region, following the patterning, using the pattern, from a bottom portion of the first etching region to a semiconductor layer for forming a current confining structure, the semiconductor layer being provided one of in the upper mirror and between the upper mirror and the active layer, below the first etching region;
    forming the current confining structure by oxidizing, from the second etching region, a part of the semiconductor layer for forming the current confining structure; and
    forming, in a light emitting portion on a front surface side of the upper mirror, the surface relief structure by the stepped structure by etching, following the patterning, using the pattern, a part of the upper mirror,
    wherein the second etching region is smaller in depth than the first etching region.

2. A method of manufacturing a surface emitting laser according to claim 1, wherein the current confining structure is formed following the forming the surface relief structure.

3. A method of manufacturing a surface emitting laser according to claim 1, wherein the surface relief structure is formed following the forming the current confining structure.

4. A method of manufacturing a surface emitting laser according to claim 1, wherein the etching in the forming the first etching region is one of wet etching and dry etching.

5. A method of manufacturing a surface emitting laser according to claim 1, wherein the etching in the forming the second etching region is one of wet etching and dry etching.

* * * * *